(12) United States Patent
Chang

(10) Patent No.: US 6,835,504 B2
(45) Date of Patent: Dec. 28, 2004

(54) PHOTOMASK WITH ILLUMINATION CONTROL OVER PATTERNS HAVING VARYING STRUCTURAL DENSITIES

(75) Inventor: Ching-Yu Chang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 248 days.

(21) Appl. No.: 10/144,893

(22) Filed: May 13, 2002

(65) Prior Publication Data

US 2003/0211399 A1 Nov. 13, 2003

(51) Int. Cl.[7] .............................................. G03F 9/00
(52) U.S. Cl. ...................................................... 430/5
(58) Field of Search ............................. 430/5, 30, 308, 430/306, 322, 323, 324; 378/34, 35

(56) References Cited

U.S. PATENT DOCUMENTS 5,789,117 A * 8/1998 Chen .............................. 430/5
6,071,652 A * 6/2000 Feldman et al. ................ 430/5
6,534,221 B2 * 3/2003 Lee et al. ........................ 430/5

* cited by examiner

Primary Examiner—Saleha R. Mohamedulla
(74) Attorney, Agent, or Firm—Stout, Uxa, Buyan & Mullins, LLP

(57) ABSTRACT

A photomask is constructed to include a substrate, a transmission control layer, and a reflective layer. The photomask may be used to pattern a photoresist layer deposited during the manufacturing process of semiconductor integrated circuits, and may be particularly useful for patterning photoresist layers in situations where the density of the structures varies across the photoresist layer and thus varies across the corresponding pattern on the photomask. The photomask can compensate for the different structural densities by adjusting the thickness of the transmission control layer. Areas of the photomask that have a lower structural density and therefore have a higher light intensity can be formed to have a thicker transmission control layer as compared to areas which have a higher structural density and which already have a lower light intensity.

21 Claims, 4 Drawing Sheets

PHOTOMASK WITH ILLUMINATION CONTROL OVER PATTERNS HAVING VARYING STRUCTURAL DENSITIES

BACKGROUND OF THE INVENTION

1. Field of the invention

The present invention relates generally to semiconductor fabrication methods and, more particularly, to a photomask with illumination control for controlling the intensity of light that is passed through a plurality of areas on the photomask having different structural densities.

2. Description of Related Art

An almost unbridled movement in the semiconductor industry toward augmented processing power continues to spurn the industry-wide movement toward greater device performances and densities. In seeking to achieve these ends, the transistors used to form integrated circuits are made smaller and packed denser to increase the overall performance of the device. Regarding device densities, current technologies allow for the creation and positioning of over a billion transistors on the surface of a semiconductor, and this number is likely to continue to increase in the future. As devices are developed, the precise positioning and uniformity of the components that form the transistors continues to be an important feature in the manufacturing process of integrated circuits.

As a result of the greater number of transistors in modern integrated circuits, multiple interconnect layers are implemented to electrically connect the transistors. An interconnect layer can comprise very thin conductive lines precisely positioned and surrounded by a dielectric material to prevent cross-talk within the interconnect layer. Neighboring interconnect layers are separated by an interlayer dielectric layer in an effort to attenuate cross-talk between interconnect layers.

Within a semiconductor integrated circuit, the conductive lines in the multiple interconnect layers are typically connected to one another through the use of via. A via is a precisely positioned aperture formed in the interlayer dielectric that is filled with a conductive material for the facilitation of an electrical interconnection between the conductive lines in the interconnect layers.

One of the processing steps used during the manufacturing process of transistors, conductive lines and via is photolithography. Photolithography is used numerous times during the manufacturing process and is one of the more important as well as one of the limiting processes for determining the maximum density and final reliability of the integrated circuits. Photolithography is particularly important in positioning the transistors, interconnect layers and via and in ensuring their uniformity. Current photolithography technologies allow for the manufacture of devices with features smaller than 0.25 micron. The size of the possible features will undoubtedly continue to shrink in the future as photolithography processes continues to improve.

A typical photolithographic process is implemented by depositing onto a working surface, by some means (usually a spinner), a layer of photosensitive resist which can be patterned by exposure to ultraviolet (UV) light or another radiation type. The working surface may be a semiconductor wafer, interconnect layer or other layer depending on the current manufacturing stage of the integrated circuits. The photoresist layer is sensitive to light and may be patterned based on exposing the photoresist to a corresponding pattern of light. The frequency of the light can be very important in determining the size of the integrated circuit features which may be created. Smaller features may be made by higher frequencies (shorter wavelength) light sources. Current efforts are being expended to develop 248 nm (KrF excimer laser lithography), 13.4 nm (extreme ultraviolet lithography), and 1.0 nm (X-ray lithography) wavelength light lithography systems.

When exposed to light, photoresist may either be hardened or softened, depending on the type of photoresist used. Positive photoresist, also known as light-softening photoresist, can be depolymerized by exposure to radiation such as UV light. Therefore, with positive photoresist, areas exposed to radiation are dissolved upon placement in a developer, while the masked, unexposed areas remain unaffected. On the other hand, negative photoresist, which is a light-hardening photoresist, can be polymerized by exposure to radiation, meaning that the exposed areas remain, while the covered areas are dissolved. Thus, depending on the type of photoresist utilized, the pattern transferred to the photoresist on the wafer is either a positive or a negative image of the photomask pattern.

To undergo exposure, the photoresist covered wafer is placed beneath a photomask designed to prevent the penetration of radiation through certain portions of the photoresist. Predetermined areas of the photoresist then undergo a degree of polymerization or depolymerization, which can be a function of the nature and extent of photoresist exposure to the radiation.

The photomask operates as a reticle by creating a pattern of light when it is placed between a light source and a photoresist layer spread over a wafer. The photomask forms the pattern by having areas that block the light and other areas that allow the light to pass from the light source to the photoresist layer. The pattern of light created by the photomask is typically for a single die on a wafer. A lens may be positioned between the photomask and the photoresist layer to reduce the size of the pattern and to focus the pattern of light onto the die. The lithography tool steps to the next die on the wafer and repeats the process until all the die on the wafer have been exposed to the pattern of light created by the photomask.

A chemical bath known as a developer can then be used to dissolve parts of the photoresist which remain relatively depolymerized after the radiation by placing the wafer therein and allowing the wafer to be rinsed for a designated time period. Having received the pattern from the photomask, the layer of photoresist on the wafer is typically referred to as a layer of patterned photoresist. The presence or absence of photoresist across the working surface creates a pattern or template to be used by subsequent processing steps of the integrated circuit. For example, an etching or an ion implantation process may be used after the lithography step on the exposed areas without photoresist to continue the manufacturing process of the integrated circuit.

However, conventional photolithography often overexposes and/or underexposes areas on the photoresist layer. This problem can arise when the density of features in the pattern is non-uniform across the surface of the photomask. Areas with a dense pattern (areas that tend to block more of the light) on the photomask tend to underexpose the photoresist while areas on the photomask with a less dense pattern (areas that tend to block less of the light) tend to overexpose the photoresist. Adjustments made to correct for underexposure of the photoresist layer tend to exasperate the overexposure condition and vice versa.

A need thus exists in the prior art for a photomask, having a pattern defining a plurality of areas of different structural densities, that can facilitate better control of the light intensity passing therethrough to a photoresist layer. Such a photomask should allow for the existence of arrays and mini-arrays without the need of biasing the light intensity passing to a photoresist layer with a critical dimension (CD) bias. The CD bias may create areas of under or overexposure of the photoresist layer. Such a CD bias can be difficult to control, and the degree of underexposure or overexposure may vary between processing cycles. A further need exists in the prior art for a method of manufacturing the photomask so that an unbiased light intensity can be passed through the photomask to the photoresist layer.

SUMMARY OF THE INVENTION

The present invention addresses these needs by providing a photomask, and a method for manufacturing the photomask, that allow the light intensity to be unbiased even between arrays and mini-arrays or isolated and dense regions. A photomask may thus be constructed and used that minimizes over and underexposure due to different structural densities of the pattern on the photomask without the use of optical proximity correction (OPC) or other reticle enhancement techniques (RET) which can increase the complexity and cost of the photolithography process.

In one embodiment, the photomask herein disclosed includes a transparent substrate, a slightly opaque transmission control layer and a patterned, opaque reflective layer. The patterned reflective layer creates a pattern that either blocks or permits passage of light in different areas as the light travels to the photoresist layer. However, certain areas in the pattern on the photomask may have a greater structural density of the reflective layer than other areas. It is recognized in accordance with the invention that areas on the pattern having a higher structural density of the reflective layer tend to underexpose the photoresist layer in areas of the pattern where light is desired. Likewise, it is recognized in accordance with the invention that areas on the pattern having a lower structural density of the reflective layer tend to overexpose the photoresist layer in areas of the pattern where light is desired. In accordance with an aspect of the present invention, the under and overexposure issue is addressed by the provision of a transmission control layer which can be engineered to control an attenuation of light intensity as the light passes through the transmission control layer.

According to one aspect of the present invention, an attenuation of the light intensity is controlled by altering thickness of the transmission control layer. The transmission control layer is slightly opaque and therefore attenuates the light intensity in relation to the thickness of the transmission control layer. For example, a thicker transmission control layer may be formed in areas that otherwise would be overexposed and a thinner or no transmission control layer may be formed in areas that would otherwise be underexposed.

In accordance with another aspect of the present invention, a process for manufacturing a photomask with illumination control is provided. A transmission control layer followed by a reflective layer may be formed over a substrate. A first photoresist layer may then be deposited and patterned over the reflective layer. Absence of material in the pattern of the first photoresist layer allows apertures to be etched through the reflective layer and through a first desired distance in the transmission control layer by using the patterned first photoresist layer as a mask. A second photoresist layer may be deposited and patterned over the reflective layer. Once again, absence of material in the pattern of the second photoresist layer allows apertures to be etched through the reflective layer and through a second desired distance in the transmission control layer. The thickness of the remaining transmission control layer can be formed to be greater in areas having a lower structural density of the reflective layer than in areas having a higher structural density of the reflective layer.

The pattern on the photomask is formed by the apertures that are etched through the reflective layer on the photomask. The apertures may take the form of circles or squares which may be used, for example, to create via through dielectric layers or openings for ion implantation into a semiconductor substrate. The apertures may also be formed as elongated grooves which may be used, for example, to create electrical connections within an interconnect layer. The apertures are not limited to any given shape and may comprise other shapes or combinations of shapes as is needed.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

DETAILED DESCRIPTION OF THE PRESENTLY PREFERRED EMBODIMENTS

Figure 1:
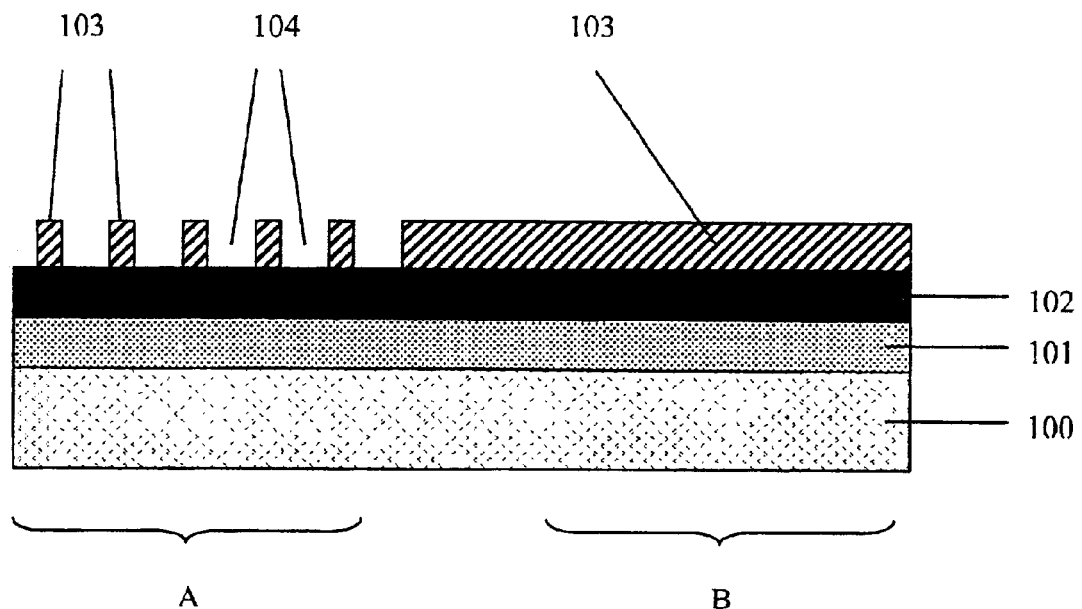
FIG. 1 is a cross-sectional view of a portion of a substrate, transmission control layer, reflective layer and a first patterned photoresist layer during an early stage in the manufacturing process of a photomask.
Figure 2:
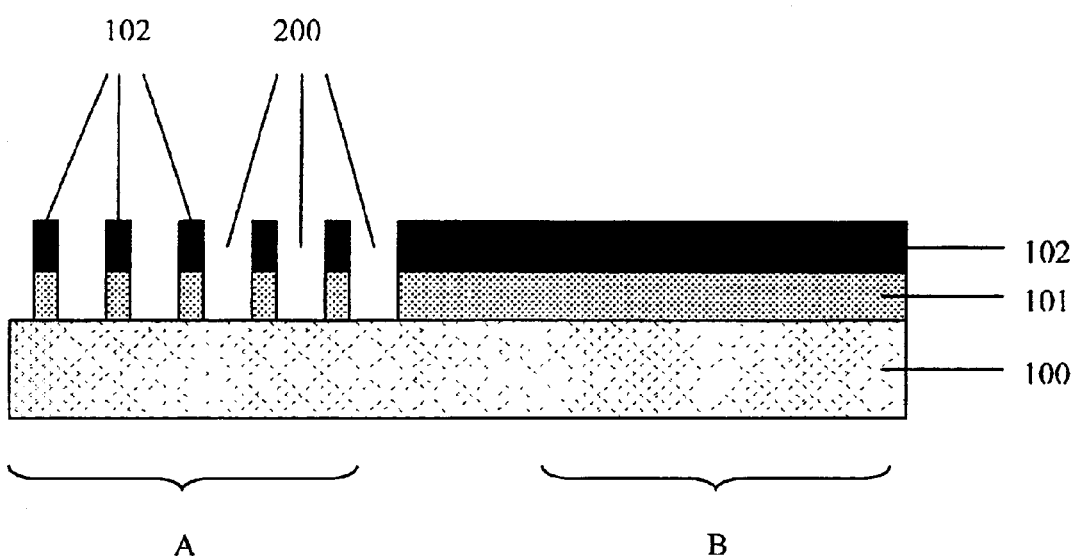
FIG. 2 is a cross-sectional view of FIG. 1 after a first etching process has removed portions of the transmission control layer and reflective layer in a first area and the first photoresist layer has been removed.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. For example, it is understood by a person of ordinary skill practicing this invention that the photomask may be used for purposes other than just in a manufacturing process for semiconductor integrated circuits. The photomask may be used in any situation where controlling the spatial intensity of a pattern of light is required. For example, the photomask may also be used during the manufacturing process of micro-electro-mechanical devices (MEMS) or micro-optics devices, and may also be used in conjunction with projectors or cameras.

It is to be understood and appreciated that the process steps and structures described herein do not cover an overly detailed process flow for the manufacture of a photomask to avoid unnecessarily obscuring the invention. The present invention may be practiced in conjunction with various fabrication techniques that are conventionally used in the art, and only so much of the commonly practiced process steps are included herein as are necessary to provide an understanding of the present invention.

Figure 4:
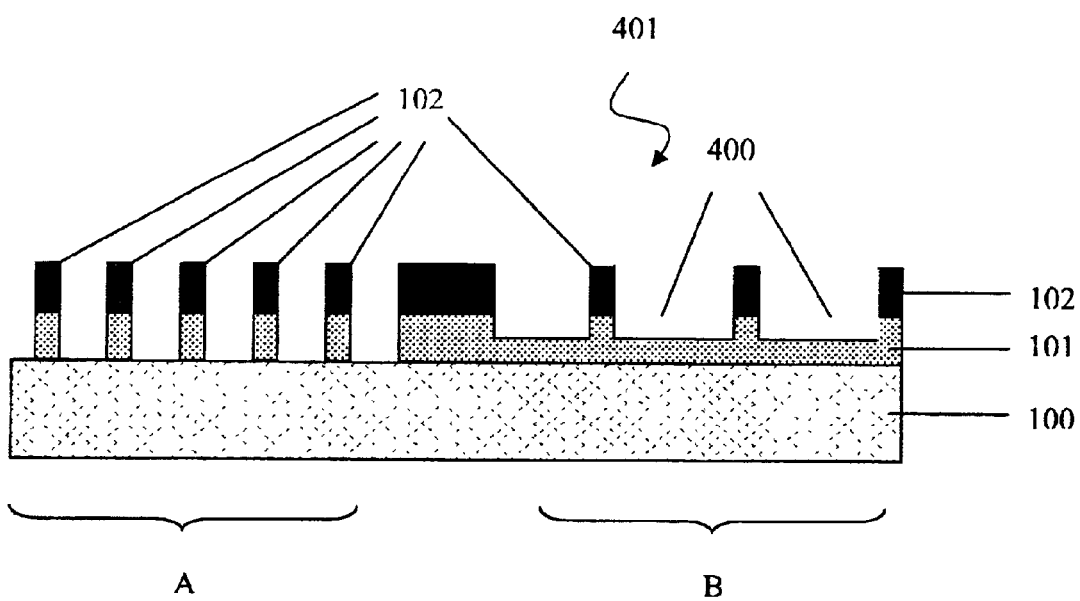
FIG. 4 is a cross-sectional view of FIG. 3 after a second etching process has removed portions of the transmission control layer and reflective layer in a second area and the second photoresist layer has been removed.
Figure 5:
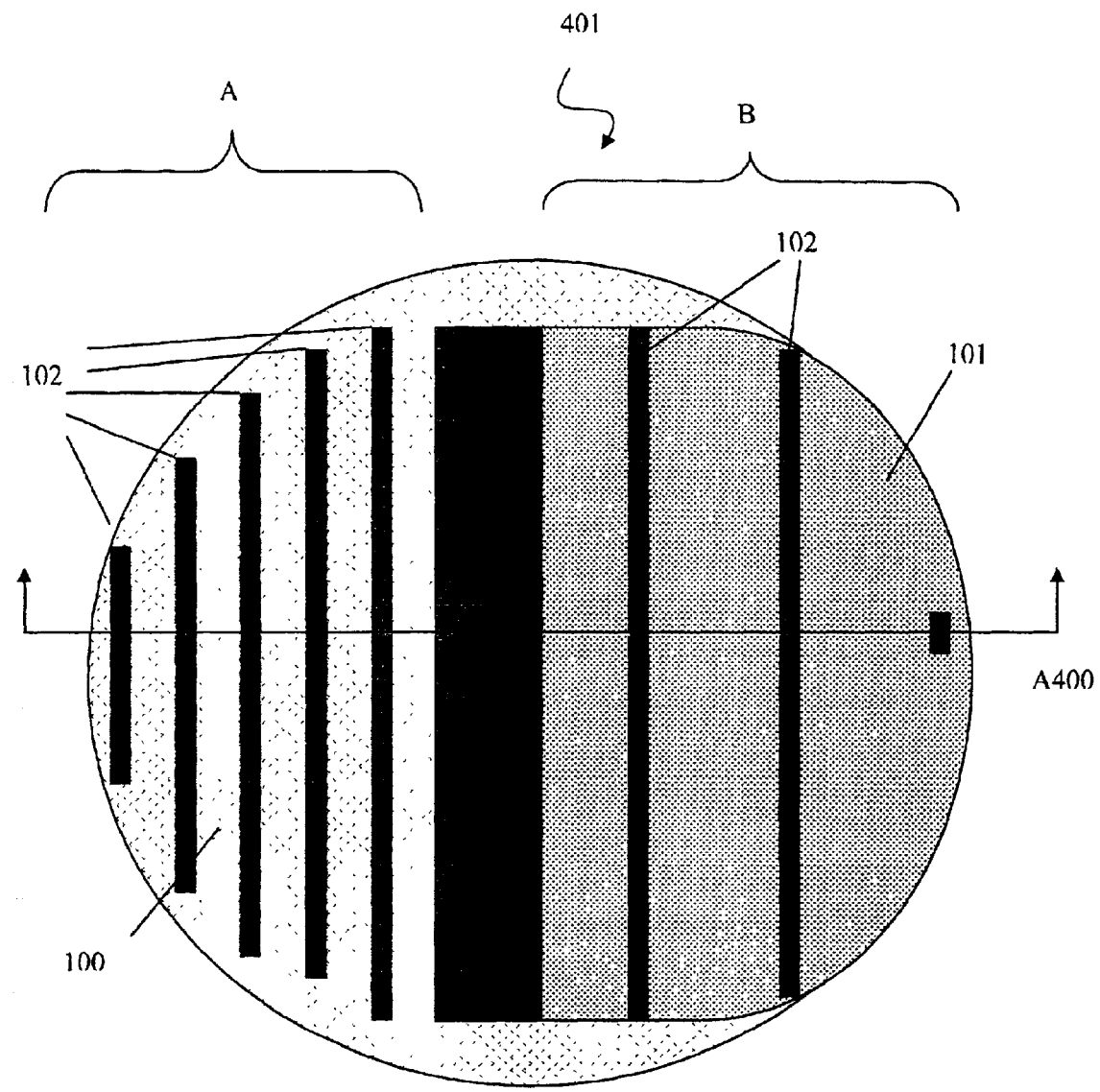
FIG. 5 is a plan view of FIG. 4 illustrating a portion of a photomask.

Referring more particularly to the drawings, FIG. 5 illustrates a greatly enlarged plan view of a circular portion of an exemplary photomask having areas A and B. FIG. 4 illustrates a cross-sectional view of the photomask of FIG. 5 along cross-sectional arrow A400. The structure of the exemplary embodiment illustrated in FIGS. 4 and 5 will now be discussed in greater detail. A substrate 100 provides the structural support for the photomask 401 and may be made to the particular dimensions required by the lithography tool that will use the photomask. Exemplary photolithography tools that may use the photomask of the invention include, but are not limited to, devices such as steppers and mask aligners. The substrate 100 is preferably relatively transparent to the frequency of the light to be used and may, for example, comprise quartz, fused-silica glass, low-hydroxyl fluorine-doped silica, calcium fluoride, or magnesium fluoride.

A transmission control layer 101 is formed over the substrate 100. The transmission control layer 101 should be slightly opaque and is thus able to attenuate the light intensity that passes through the transmission control layer 101 based on the material and the thickness of the transmission control layer 101. The transmission control layer 101 may be totally removed in some places as shown in area A, etched back to a desired thickness as shown in area B, or left at its originally formed thickness as shown between areas A and B. Thus, the light intensity that passes through the photomask 401 may be controlled/adjusted over particular areas based on, for example, the thickness of the transmission control layer 101. While two areas (A and B) are illustrated in FIGS. 4 and 5, any number of areas may be created with each area having its own individual light transmission control by adjusting the thickness, type, and/or distribution of the transmission control layer 101 in that area. The transmission control layer may comprise, for example, a layer of MoSiO, SiON, SiN or MoCR.

A patterned reflective layer 102 is formed over the transmission control layer 101. The reflective layer 102 is preferably opaque and substantially reflects or blocks the light while openings 400 in the reflective layer 102 allow the light to pass through the transmission control layer 101 and substrate 100. The pattern of the reflective layer 102 is transferred to a photoresist layer on a working surface when light is passed through the photomask 401, and reduced in size and focused by a lens onto the photoresist layer. A light source, which may produce light in frequencies, for example, in the ultraviolet or X-ray frequencies, may be used to generate the light. The patterned reflective layer 102 may comprise, for example, $Cr_xO_y$, AlO, CrF, TiN, WsiO, or Al.

In a preferred embodiment, the thickness of the transmission control layer 101 is inversely related to the density of the patterned reflective layer 102. Specifically, areas on the photomask 401 having a lower structural density of the reflective layer 102, as shown in area B, may have a thicker transmission control layer 101 compared to areas having a higher structural density of the reflective layer 102, as shown in area A. This construction can be desirable since as recognized in accordance with the present invention areas with a high structural density of the patterned reflective layer 102 (area A) tend to be underexposed during the photolithography process in relation to areas having a low structural density of the patterned reflective layer 102 (area B). Thus, adjusting the distribution of the transmission control layer 101, to thereby spatially control the light intensity, can be used to attenuate or eliminate this problem in the prior art.

Figure 6:
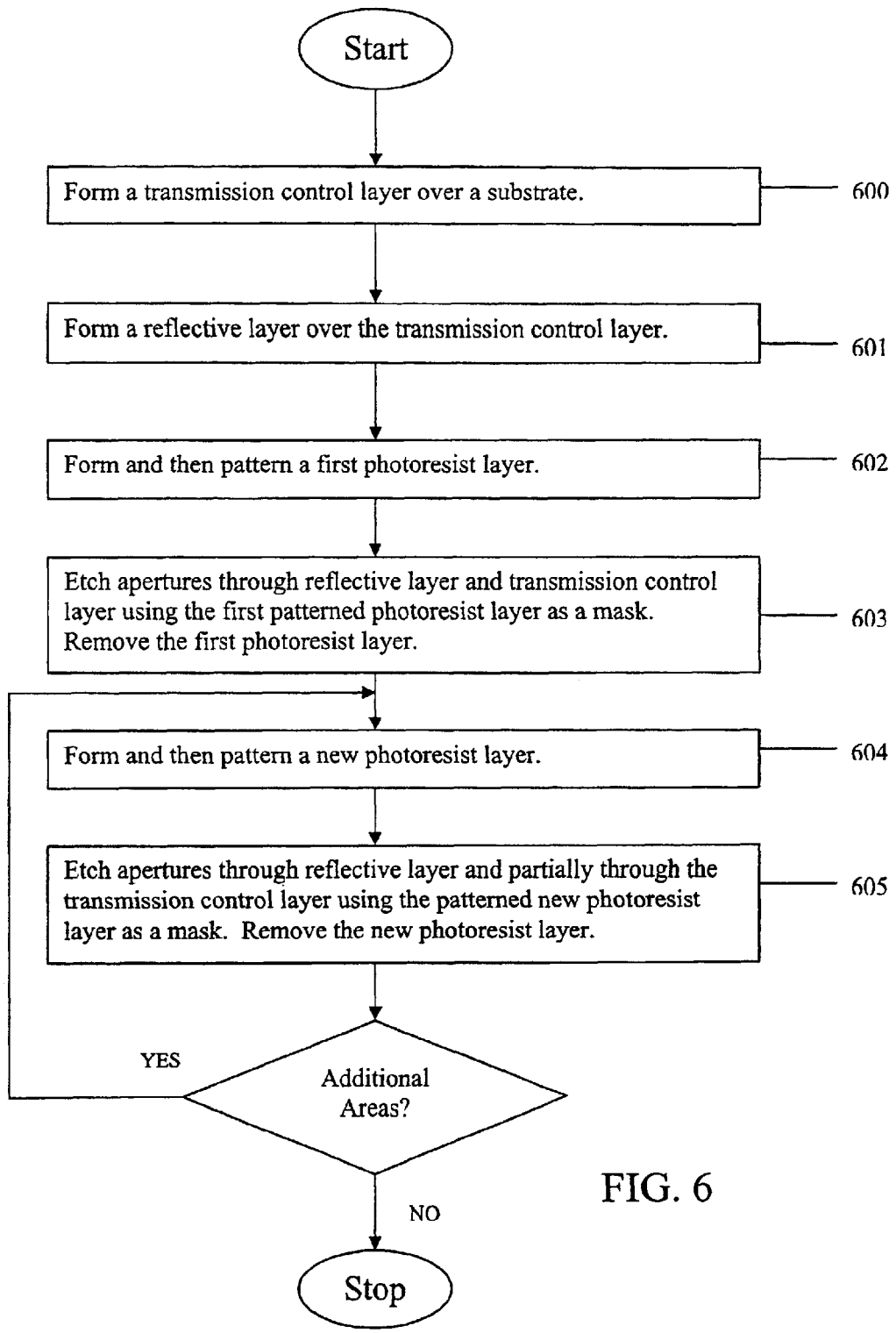
FIG. 6 is a flowchart of a process according to one embodiment of the invention.

An exemplary method of producing a photomask 401 according to one embodiment of the invention will be discussed with reference to FIGS. 1–4 and the flowchart of FIG. 6. A transmission control layer 101 is formed over a substrate 100 at Step 600. The transmission control layer 101 may comprise MoSiO while the substrate may comprise quartz. The transmission control layer 101 may be formed on the substrate 100 using known deposition processes such as chemical vapor deposition or spin coating. The transmission control layer 101 is preferably between about 500 A and 5 um thick.

A reflective layer 102 is formed over the transmission control layer at Step 601. The reflective layer 102 may comprise $Cr_xO_y$ and may be deposited onto the transmission control layer 101 using known deposition processes such as chemical vapor deposition or spin coating. The reflective layer 102 is preferably between about 100 A and 3000 A thick.

At Step 602 a first photoresist layer 103 may be formed and patterned over the reflective layer 102. The first photoresist layer 103 may be deposited using known photoresist deposition equipment and patterned using conventional photolithography equipment. The photomask is now in the manufacturing stage illustrated in FIG. 1.

In a preferred embodiment, the pattern of the photoresist is solid over some areas, as shown in area B, with apertures 104 (holes or grooves) created in other areas, as shown in area A. In a preferred embodiment, the area (in this case area A) chosen to receive the apertures 104 should have a similar final desired structural density of the reflective layer 102 and transmission control layer 101 (shown in FIG. 2). This construction allows the entire area (in this case area A) to receive the same etching process at Step 603 through the reflective layer 102 and through a desired distance of the transmission control layer 101. To the extent different structural densities or distributions of the two layers 101 and 102 are desired, additional etch processes may be implemented. Although the figures show the transmission control layer 101 being completely etched at the openings 200 in area A, any desired thickness of the transmission control layer 101 may be left remaining as is needed. It should be noted that the area that is etched does not have to be a contiguous area. The photomask is now in the manufacturing stage illustrated in FIG. 2.

Figure 3:
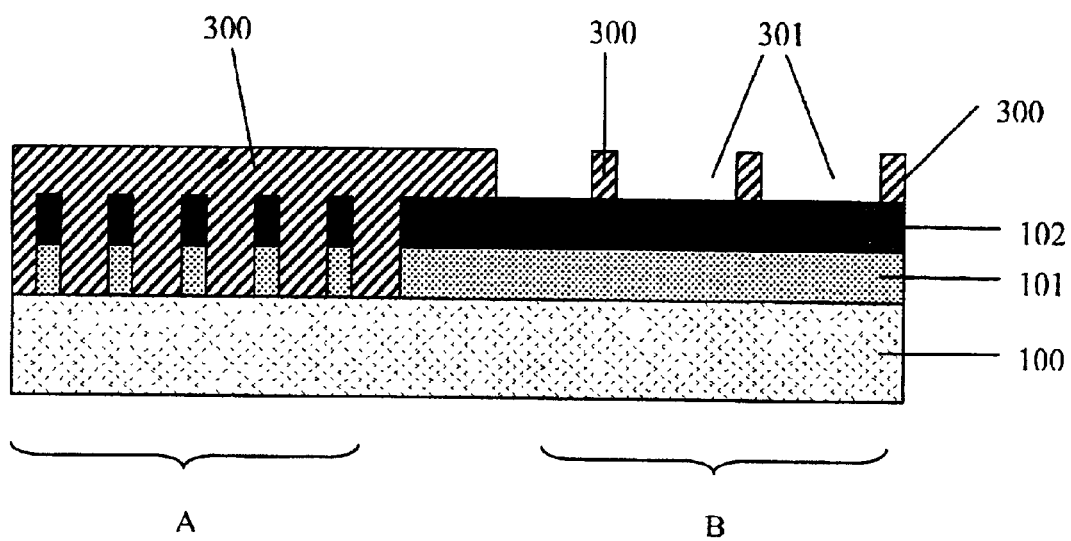
FIG. 3 is a cross-sectional view of FIG. 2 after a second photoresist layer has been deposited and patterned.

A second photoresist layer 300, illustrated in FIG. 3, may be formed and patterned over the reflective layer 102 at Step 604. The second photoresist layer 300 may be deposited and formed in a similar manner to the first photoresist layer 103, to thereby yield a photomask in the manufacturing stage shown in FIG. 3. Once again, the pattern may be solid over some areas, as shown in area A, with apertures 301 (e.g., holes or grooves) created in other areas, as shown in area B. As before, the area (in this case area B) chosen to receive the apertures 301 preferably should have a similar final desired structural density of the reflective layer 102 (shown in FIG. 4) and transmission control layer 101, so that the entire area (in this case area B) can receive the same etching process at Step 605 through the reflective layer 102 and through a desired distance of the transmission control layer 101. In one embodiment, the desired distance is about zero so that the apertures 400 extend only slightly or do not extend into the transmission control layer 101.

In an exemplary resulting structure, area A comprises a structural density of the reflective layer 102 of about 60% and area B comprises a structural density of the reflective layer 102 of about 20%. In other words, a ratio of the surface of area A not covered by the reflective layer 102 over the total surface of area A is about 40%, and a ratio of the surface of area B not covered by the reflective layer 102 over the total surface of area B is about 80%. In this example, the transmission control layer 101 provides for about 100% transmission of light through the openings 200 in area A (e.g., layer 101 is removed) and provides for about 50% transmission of light through the openings 400 in area B. Thus, the total transmission of light into the mask between area A and B has the same value about 40%.

The steps of forming a new photoresist layer, patterning the new photoresist layer, and etching the reflective layer 102 while leaving a desired thickness of the transmission control layer 101, may be repeated as many times as needed. Thus, areas on the photomask 401 having different structural densities of the reflective layer 102 can allow for uniform illumination of the photoresist without the need for a CD bias. It should be noted that while the invention has been described with reference to simplified figures, millions or more apertures may be incorporated into any given pattern. The complexity of the pattern is limited only by current technology and thus should not be considered a limitation on the invention.

In alternative embodiments, the present invention may be used in conjunction with phase-shift masking techniques to create attenuated patterned light or radiation that is also phase shifted by some degree (e.g., 180 degrees). Such phase shifting techniques, as known in the art, may act to set up interference patterns that may enhance edge contrast of the projected image, and thus result in higher resolution.

It should be noted that while a photomask able to compensate for two areas having different structural densities on the photomask is disclosed, photomasks able to compensate for any number of different areas having different structural densities may also be constructed and used. The light intensity in additional areas may be engineered to be equal in intensity to the previously mentioned areas by incorporating further adjustments to the thickness of the transmission control layer in those additional areas. Each additional area (of different structural density) in which it is desirable to have the light intensity uniform can be formed for example with an additional patterned photoresist layer followed by an additional etching process. Moreover, in other alternative embodiments one or more additional transmission control layers of the same, similar and/or different materials may be constructed, over, on or within the substrate or existing transmission control layer. It is even conceivable that the substrate can be formed of different materials and thicknesses in different areas to thereby effectively serve as a transmission control layer in the areas of greater thicknesses.

In view of the foregoing, it will be understood by those skilled in the art that the methods of the present invention can facilitate the making and using of a photomask, and in particular, a photomask with control over the spatial light intensity that forms a pattern. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Such variations and modifications, however, fall well within the scope of the present invention as set forth in the following claims.

What is claimed is:

1. A photomask with illumination bias control, comprising:
   (a) a substrate;
   (b) a transmission control layer formed over the substrate, wherein the transmission control layer has a first thickness in a first area greater than a second thickness in a second area; and
   (c) a patterned reflective layer formed over the transmission control layer, wherein a first structural density of the patterned reflective layer over the first area of the transmission control layer is less than a second structural density of the patterned reflective layer over the second area of the transmission control layer.

2. The photomask as set forth in claim 1, wherein the first structural density of the patterned reflective layer over the first area of the transmission control layer is about 20% and the second structural density of the patterned reflective layer over the second area of the transmission control layer is about 60%.

3. The photomask as set forth in claim 2, wherein the transmission control layer provides for about 50% transmission of light through the first thickness and provides for about full transmission of light through the second thickness.

4. The photomask as set forth in claim 1, wherein the substrate comprises quartz.

5. The photomask as set forth in claim 1, wherein the transmission control layer comprises MoSiO.

6. The photomask as set forth in claim 1, wherein the patterned reflective layer comprises $Cr_xO_y$.

7. A photomask with illumination bias control, comprising:
   (a) a substrate;
   (b) a transmission control layer formed aver the substrate, wherein the transmission control layer has a first attenuation level of light in a first area greater than a second attenuation level of light in a second area; and
   (c) patterned reflective layer formed over the transmission control layer, wherein a first structural density of the patterned reflective layer over the first area of the transmission control layer is less than a second structural density of the patterned reflective layer over the second area of the transmission control layer.

8. The photomask as set forth in claim 7, wherein the first structural density of the patterned reflective layer over the first area of the transmission control layer is about 20% and the second structural density of the patterned reflective layer over the second area of the transmission control layer is about 60%.

9. The photomask as set forth in claim 7, wherein the first attenuation level is about 50% and the second attenuation level is about zero.

10. The photomask as set forth in claim 7, wherein the substrate comprises quartz.

11. The photomask as set forth in claim 7, wherein the transmission control layer comprises MoSiO.

12. The photomask as set forth in claim 7, wherein the patterned reflective layer comprises $Cr_xO_y$.

13. A method of manufacturing a photomask, comprising the steps of:
   (a) forming a transmission control layer over a substrate;
   (b) forming a reflective layer over the transmission control layer;
   (c) etching a first plurality of apertures through the reflective layer and through a first distance in the transmission control layer; and
   (d) etching a second plurality of apertures through the reflective layer and through a second distance in the transmission control layer, wherein the first distance is not equal to the second distance.

14. The method as set forth in claim 13, wherein:
   the etching of a first plurality of apertures comprises forming and then patterning a first photoresist layer over the reflective layer, and etching a first plurality of apertures through the reflective layer and through a first distance in the transmission control layer using the patterned first photoresist layer as a mask; and
   the etching of a second plurality of apertures comprises forming and then patterning a second photoresist layer over the reflective layer, and etching a second plurality of apertures through the reflective layer and through a second distance in the transmission control layer using the patterned second photoresist; layer as a mask.

15. The method as set forth in claim 13, wherein the first plurality of apertures are etched in a first area over the substrate and the second plurality of apertures are etched in a second area over the substrate.

16. The method as set forth in claim 15, wherein:
   a structural density of the reflective layer at the first area is substantially greater than a structural density of the reflective layer at the second area; and
   the first distance is greater than the second distance.

17. The photomask as set forth in claim 16, wherein the first plurality of apertures are etched down to the substrate in the first area.

18. The photomask as set forth in claim 16, wherein the second distance is zero.

19. The method as set forth in claim 16, wherein the substrate comprises quartz.

20. The method as set forth in claim 16, wherein the transmission control layer comprises MoSiO.

21. The method as set forth in claim 16, wherein the patterned reflective layer comprises $Cr_xO_y$.

* * * * *